United States Patent
Kruger et al.

(10) Patent No.: US 8,394,454 B2
(45) Date of Patent: Mar. 12, 2013

(54) METHOD AND APPARATUS FOR PRECURSOR DELIVERY SYSTEM FOR IRRADIATION BEAM INSTRUMENTS

(75) Inventors: Rocky Kruger, Dallas, TX (US); Aaron Smith, Dallas, TX (US); Thomas M. Moore, Dallas, TX (US)

(73) Assignee: Omniprobe, Inc., Dallas, TX (US)

( * ) Notice: Subject to any disclaimer, the term of this patent is extended or adjusted under 35 U.S.C. 154(b) by 787 days.

(21) Appl. No.: 12/399,579

(22) Filed: Mar. 6, 2009

(65) Prior Publication Data

US 2009/0223451 A1 Sep. 10, 2009

Related U.S. Application Data

(60) Provisional application No. 61/034,958, filed on Mar. 8, 2008.

(51) Int. Cl.
 C23C 16/00 (2006.01)
 C23C 8/00 (2006.01)
(52) U.S. Cl. .................... 427/248.1; 427/585
(58) Field of Classification Search ............... 427/248.1, 427/585
See application file for complete search history.

(56) References Cited

U.S. PATENT DOCUMENTS

| | | |
|---|---|---|
| 3,847,115 A | 11/1974 | Tashbar |
| 5,120,925 A | 6/1992 | Ohnishi et al. |
| 5,182,170 A | 1/1993 | Marcus et al. |
| 5,288,367 A | 2/1994 | Angell et al. |
| 5,683,547 A | 11/1997 | Azuma et al. |
| 6,002,136 A | 12/1999 | Naeem |
| 6,118,122 A | 9/2000 | Koyama et al. |
| 6,409,876 B1 | 6/2002 | McQuarrie et al. |
| 6,451,692 B1 | 9/2002 | Derderian et al. |
| 6,492,261 B2 | 12/2002 | Gavish et al. |
| 6,627,538 B2 | 9/2003 | Gavish et al. |
| 6,638,580 B2 | 10/2003 | Gavish |
| 6,751,516 B1 | 6/2004 | Richardson |
| 6,822,245 B2 | 11/2004 | Muto et al. |
| 7,112,790 B1 | 9/2006 | Wang |
| 7,250,318 B1 | 7/2007 | Johnson et al. |
| 7,381,971 B2 | 6/2008 | Moore et al. |

(Continued)

FOREIGN PATENT DOCUMENTS

JP 11-086772 3/1999

OTHER PUBLICATIONS

International Bureau of WIPO, International Application No. PCT/US2009/001480, International Preliminary Report on Patentability, Sep. 14, 2010.

(Continued)

*Primary Examiner* — Kelly M Gambetta
(74) *Attorney, Agent, or Firm* — John A. Thomas

(57) ABSTRACT

A precursor delivery system for an irradiation beam instrument having a vacuum chamber includes an injection tube for injecting gasses into the vacuum chamber of the instrument and a main gas line having an inlet and an outlet. The outlet is connected to the injection tube, and the inlet is connected to a sequential pair of valves connected to a carrier gas source. A crucible for holding precursor material is selectively connected to the main gas line at a location between the pair of valves and the injection tube. The source of carrier gas may be selectively connected to the inlet by sequential operation of the pair of carrier gas valves, so that pulses of carrier gas assist the flow of precursor material to the injection tube. Rapid purging of the system between precursors is enabled by a valve selectively connecting the main line to an envelope in communication with the instrument vacuum. Methods of CVD and etching using the system are also disclosed.

8 Claims, 6 Drawing Sheets

U.S. PATENT DOCUMENTS

| | | |
|---|---|---|
| 7,423,263 B2 | 9/2008 | Hong et al. |
| 2001/0000160 A1 | 4/2001 | Schwaiger et al. |
| 2002/0197851 A1 | 12/2002 | Gavish et al. |
| 2004/0016403 A1 | 1/2004 | Gavish |
| 2004/0020434 A1 | 2/2004 | Gavish et al. |
| 2004/0033425 A1 | 2/2004 | Koops et al. |
| 2006/0022136 A1* | 2/2006 | Moore .................. 250/309 |
| 2008/0250881 A1 | 10/2008 | Dona |
| 2008/0258056 A1 | 10/2008 | Zaykova-Feldman et al. |
| 2008/0283768 A1 | 11/2008 | van Gaasbeek et al. |
| 2008/0296498 A1 | 12/2008 | Hong |

OTHER PUBLICATIONS

International Searching Authority, International Application No. PCT/US2009/001480, International Search Report and the Written Opinion, Oct. 22, 2009.

R. M. Langford, D. Ozkaya, J. Sheridan and R. Chater, Effects of Water Vapour on Electron and Ion Beam Deposited Platinum, Microsc Microanal 10 (Suppl 2), 2004.

* cited by examiner

METHOD AND APPARATUS FOR PRECURSOR DELIVERY SYSTEM FOR IRRADIATION BEAM INSTRUMENTS

CROSS-REFERENCE TO RELATED APPLICATIONS

This application is related to co-pending application Ser. No. 11/186,706, filed Jul. 21, 2005.

CLAIM FOR PRIORITY

This application claims the priority of U.S. Provisional Patent Application Ser. No. 61/034,958, filed Mar. 8, 2008, which application is incorporated into the present application by reference.

BACKGROUND

1. Technical Field

This application relates to the technology of precision gas injection for gas-assisted reactions in irradiation beam instruments.

2. Background Art

Irradiation beam instruments include those using charged-particle beams, such as a scanning electron microscopes (SEM) or focused-ion beam (FIB) microscopes, or instruments using beams of light, such as scanning laser microscopes, or instruments that combine these technologies, such as triple beam SEM/FIB/laser microscopes. The gas-assisted reactions include gas-assisted deposition of fine structures using chemical vapor-deposition (CVD) techniques or etch reactions in which the precursor gas is directed onto a sample surface where one or more irradiation beams has also been directed.

The rates of precursor flow and carrier gas flow in a system affect the rate of beam-assisted reactions, and thus the effectiveness of the deposition or etch process. We disclose methods and apparatus for improved control of these variables, with the resulting advantages of more precise work on finer structures than is currently available. This reduces the waste of expensive precursor materials between operation cycles.

Also, the lines and chambers in a precursor delivery system are preferably purged by some inert gas between the flows of different precursors. Existing systems rely on venting the lines and chambers immediately to the FIB vacuum chamber. It would be highly desirable to shorten the time needed to purge a precursor delivery system while also avoiding contamination of the system vacuum caused by venting the precursor delivery system through the instrument vacuum chamber.

DRAWINGS

DESCRIPTION

In this application, we use the term "FIB" or "irradiation-beam instrument" generically for any kind of instrument using one or more irradiation beams to assist chemical vapor-deposition procedures in a vacuum. These terms as used here thus include instruments using ion beams, electron beams, other charged particle beams, or light energy, such as a beam of laser light, or any combination of these beams.

Figure 1:
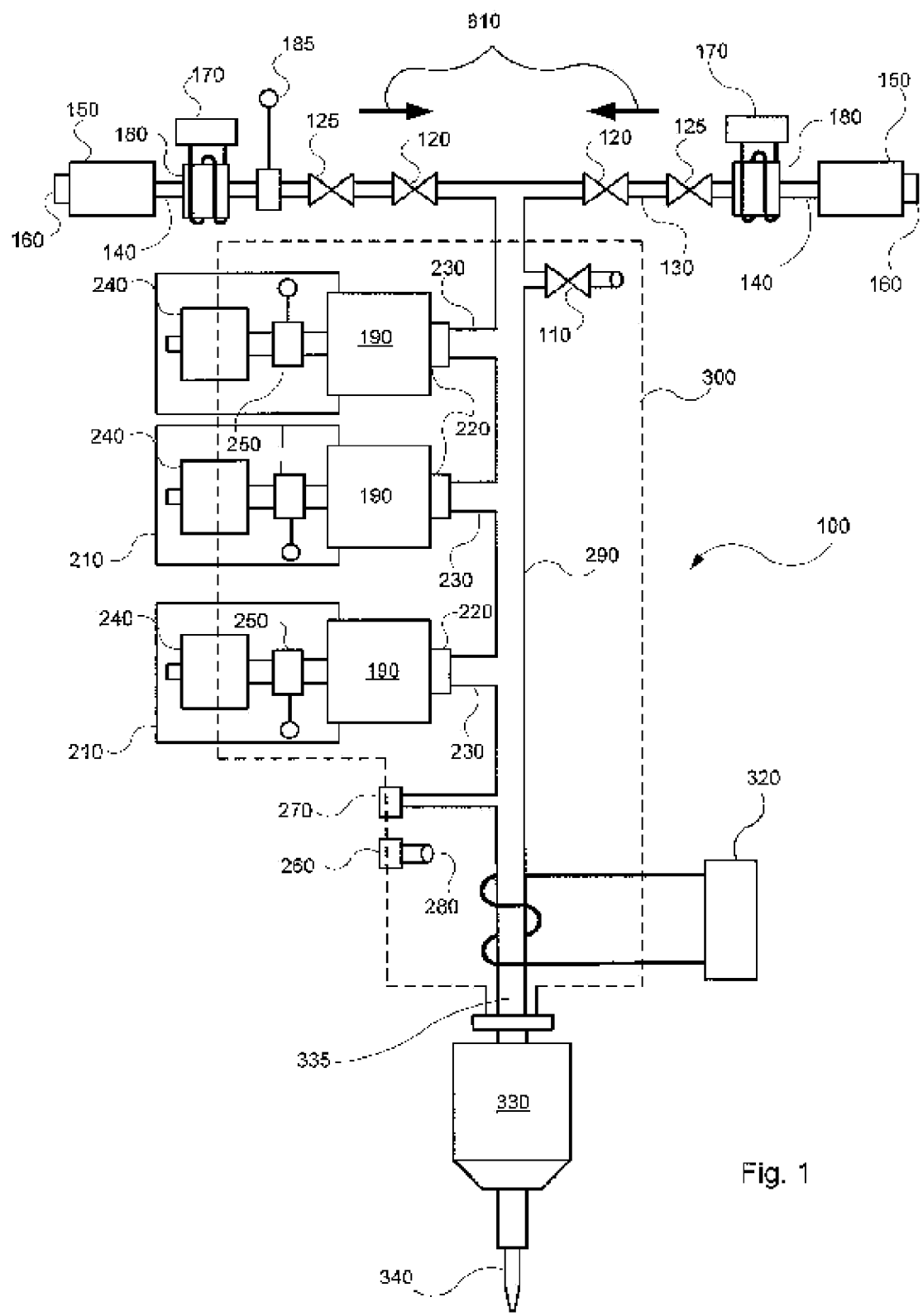
FIG. 1 is a schematic view of an embodiment of a gas injection system equipped with multiple sources and a gas flow control system.

FIG. 1 shows a schematic diagram of the gas-injection system (100) of the preferred embodiment. In this embodiment, there are two sources (150) of purge or carrier gasses, and three crucibles (190) containing the precursor gas sources. Of course, the system (100) may be implemented with only one carrier gas source (150) and one crucible (190) of precursor source, or some different combination of carrier and precursor sources (150, 190).

Each crucible (190) is removably connected via a transfer tube (230) to a main line (290). The crucibles (190) can hold solid, liquid or gaseous compounds. A typical example from the prior art is carbonyl metals from the group of Pt or W. When heated or cooled to the temperature that produces an appropriate vapor pressure, these compounds produce a vapor, which enters the transfer tubes (230) and then the main line (290). As shown in FIG. 1, the main gas line (290) has an inlet (295) and an outlet (335). Gasses from the crucibles (190) (if more than one) mix in the main line (290). The mixed gasses exit the outlet (335) of the main line (290), optionally through a chamber (330), for additional mixing, and thereafter through an injection tube (340) or "needle" to the sample surface. The crucibles (190) and the main line (290) are mounted in an enclosed volume or "envelope" (300), so as to share the vacuum system with the FIB. The mixing chamber (330) and the injection tube (340) are of course also within the vacuum chamber of the FIB when the system is in use. Each crucible (190) has a pneumatic valve (220) that can isolate the contents of the crucible (190) from the transfer tube (230) and thus from the FIB vacuum. The crucible isolation valve (220) thereby regulates the flow of precursor gas. In the preferred embodiment, a heating and cooling means (240), preferably a thermoelectric device, is connected to each crucible (190) to control the temperature of the contents of the crucible (190) and thus the vapor pressure of the precursor gas released from the precursor compound or element in the crucible (190). A suitable Peltier thermoelectric cooler is the model SH1.0-95-05L-1 by Melcor of Trenton, N.J.

The temperature of the crucible (190) is monitored, preferably by a resistive temperature detector (RTD) (250), as explained below. A suitable RTD is the model S202PD by Minco Products, Inc. of Minneapolis, Minn.

A carrier or purge gas, such as nitrogen or other inert gas, is delivered from the gas reservoirs (150) into the main line (290) to both dilute and carry the source gasses to the final mixing chamber (330). When the reservoir valve (160) is open, the carrier gas flows through an input line (140) into a heating chamber (180), where it is heated by a heater (170) until the desired temperature. An electrical tape heater may be used. The carrier gas temperature is also monitored, preferably by an RTD (185). The carrier gas flow is controlled via a main valve (110) (for purging), and two solenoid valves (120, 125) in each input line (140) corresponding to a carrier gas reservoir (150). In each line, as shown in FIG. 1, a first solenoid valve (120) is connected through a relatively short transfer tube (130) to a second solenoid valve (125). As explained below, operation of the main valve (110) and the two solenoid valves (120, 125) in the input line (140) allows the pulsing of the gas stream eventually delivered to the sample surface. The solenoid valves are preferably electrically controlled. The VHS micro-dispense valve, model INKX0511850A, from The Lee Company of Westbrook, Conn. is suitable.

Pressure within the main line (290) and the envelope (300) are monitored, preferably by a first Pirani sensor (260) open to the envelope (300), and a second Pirani sensor (270) connected to the gas main line (290) through a tube (280). A suitable device is the MicroPirani sensor kit, model 905-0012, manufactured by MKS Instruments, Inc. of Andover, Mass.

The main transfer line (290) is also heated by a heater (320) to avoid re-deposition or decomposition inside it. The gas temperatures in the input line (140) and the main line (290) are effectively monitored together by one or more RTD's (185) as shown in FIG. 41. The source gasses pass through the heated main line (290) on their way to the final mixing chamber (330). The source gasses from the transfer tubes (230) and the main line (290) are further mixed in the final mixing chamber (330) before the mixture is presented to the sample surface through the single injection tube (340).

Figure 2:
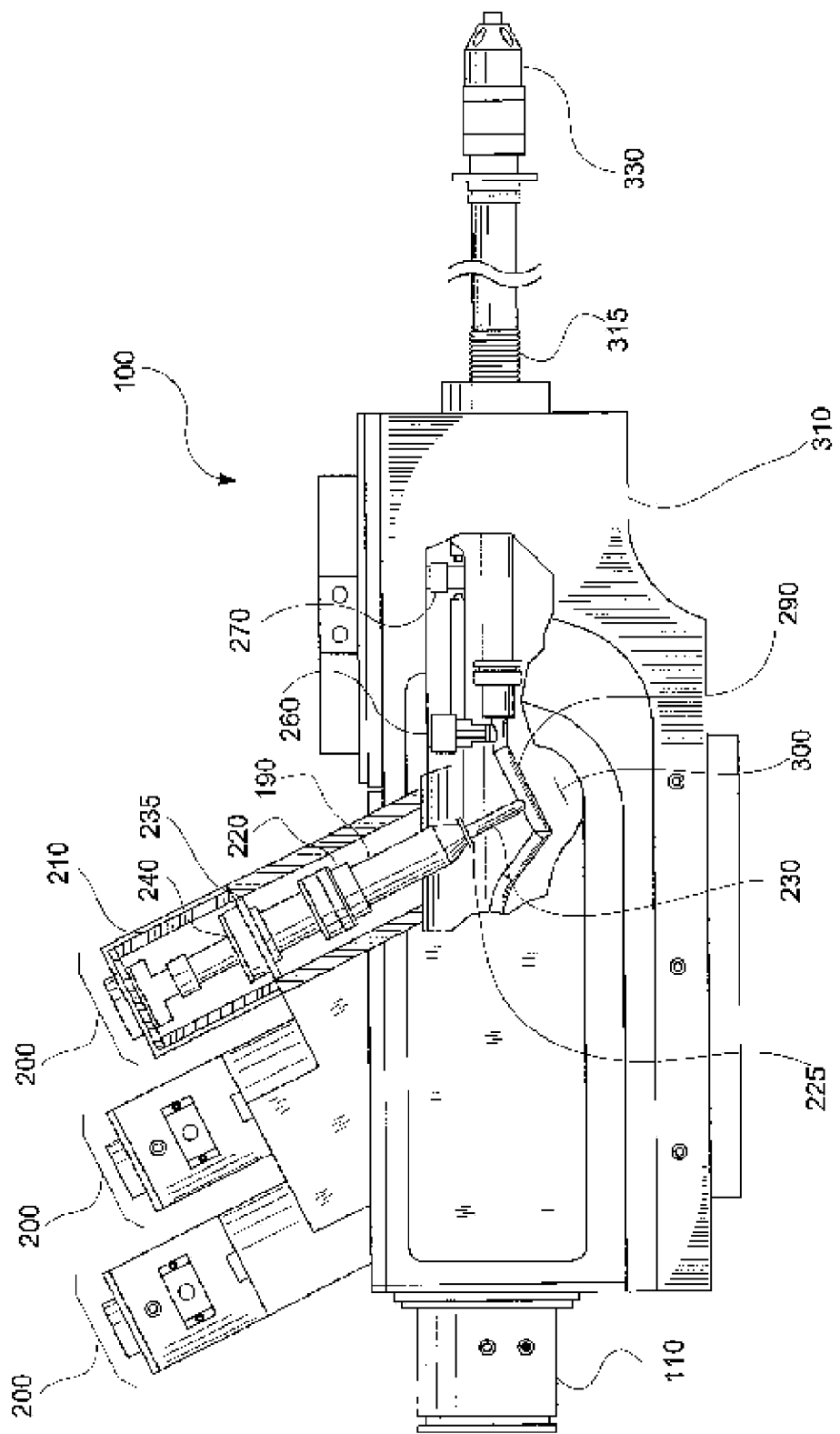
FIG. 2 is a partial cut-away view of an embodiment having three source gas crucibles.

FIG. 2 shows a cut-away drawing of a physical embodiment of the gas injection system (100). The system (100) is supported by housing (310) that seals to the FIB chamber at connection (315) on the outside of the housing (310). Each opening of a crucible (190), the gas main line (290) and the mixing chamber (330) are enclosed in the system's envelope (300). Each crucible (190) preferably has a cover (210) or "shower cap," described below, to provide air cooling by forcing air through it to cool the thermal output of the thermoelectric coolers (240). There is a vacuum seal (235) between the upper and lower parts of the crucible (190). The lower part of the crucible (190) has a connecting tube (230) for the vapor from the heated precursor source inside the crucible (190). The crucibles (190) are removably inserted into the connecting tube (230) and sealed there with an O-ring seal (225) or similar sealing means. Thermal isolation of the crucible (190) from the rest of the system (100) assists implementation of rapid temperature changes; thermal isolation may be enhanced by an insulating barrier (not shown) inside the source capsule of the crucible (190).

FIG. 2 shows a crucible assembly (200) comprising the components just described.

The Process Flow

The flow rate control of both the source gas and the carrier or purge gas is important during CVD, since it substantially controls the rate of beam-assisted reactions of the precursor compounds. Efficient control of this flow rate reduces contamination in the FIB and diminishes the amount of over spray around the area of interest. The control of the process of gas delivery into the FIB comprises four basic elements:

control of the pressure of the precursor vapor;
control of the crucible (190) temperature;
control of the carrier gas flow; and,
control of the flow during the purging of the system.

The precursor line pressure is controlled by opening and closing the crucible valve (220), changing the crucible temperature and by pre-setting the maximum line pressure allowed. The operations of opening and closing the crucible valve (220) and carrier gas solenoid valves (120, 125) are performed in a pulsing regime, where the time a carrier gas valve (120, 125) is open will be brief, approximately two milliseconds in most applications. Pre-setting the maximum value of line pressure will allow adjusting the window of operation for the duty cycle of the crucible valve (220) operation. Lower line pressure allows for greater flexibility in the gas delivery procedure than a higher line pressure. Another highly desirable feature of the method disclosed is the cleaning the system via purging, specifically, purging the main line (290) and the injection tube (340). Different purging regimes are applied for precursors used in solid form, and for the precursors used in liquid form.

Combining these features in one method allows one to use solid, liquid and gas precursors in the same hardware setup, and to control with good precision the amount of the precursor released into the system in the given time. This method can be applied to either a single crucible (190) or simultaneously to multiple crucibles (190), constituting one system.

Our procedure for gas injection into a vacuum chamber comprises two basic processes: the delivery of the precursor gas and the purging cycle.

Precursor Delivery

It is known to use a continuous flow of precursor gas to the sample of interest. Our method instead uses a pulsing regime. The frequency of the release and delivery of precursor gas is determined by a duty cycle, the parameters of which can be chosen by the user in advance and implemented under automatic control. Determining the appropriate parameters for a given precursor, sample, CVD task and type of FIB must generally be determined by experiment.

Figure 3:
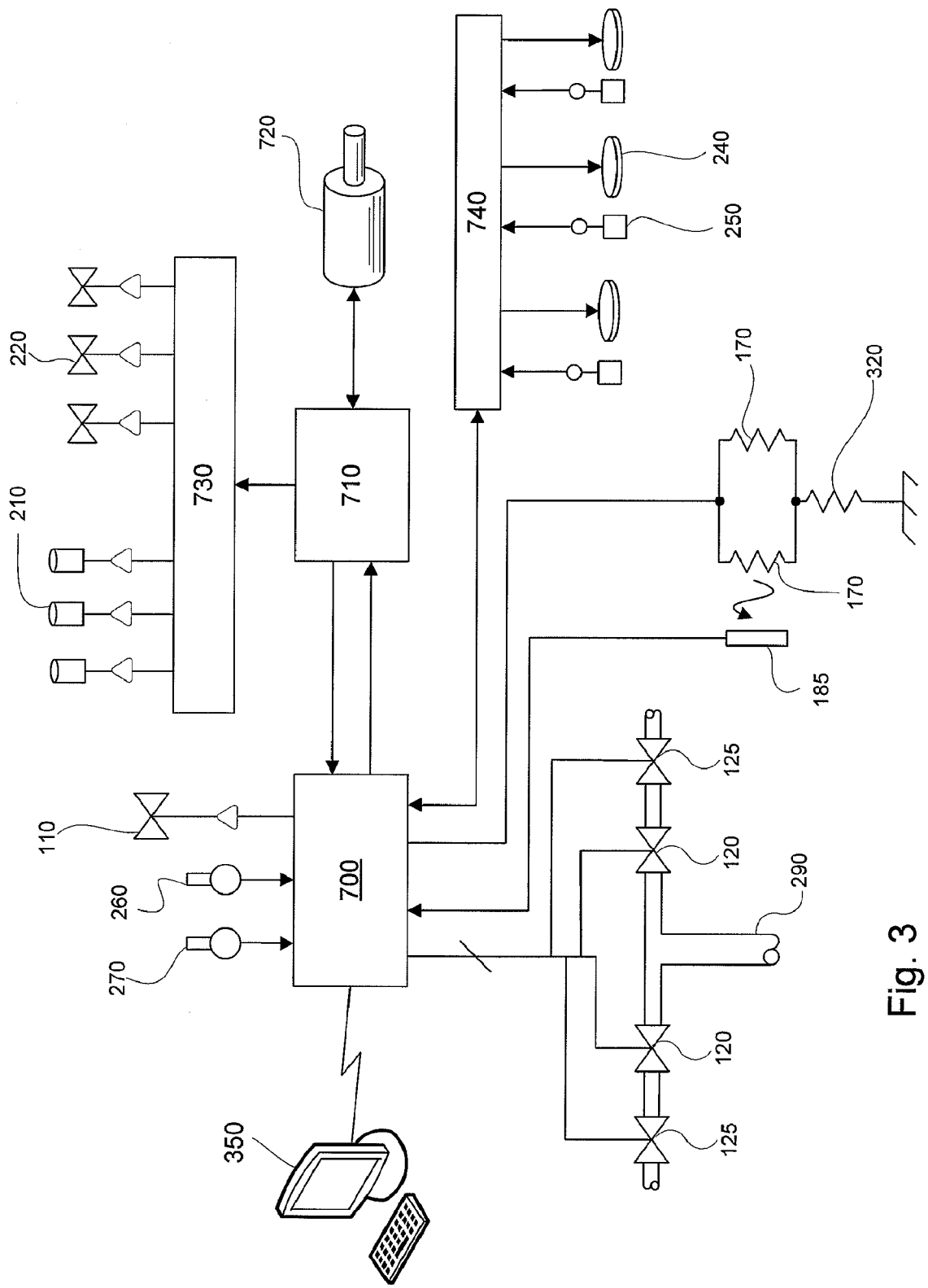
FIG. 3 is a schematic depiction of the electronic control arrangement of the preferred embodiment.

FIG. 3 is a schematic layout of an electronic and pneumatic control system for the preferred embodiment. A general-purpose computer (350) preferably runs a graphical interface program that allows an experimenter to set up various parameters related to a CVD task. The computer (350) communicates set-up parameters and control signals with, and receives feedback on temperature and pressure from, a primary controller (700), preferably via an Ethernet connection, although a serial line could be used. The primary controller (700) comprises conventional parts such as power supplies, power switches and communications circuits. In the embodiment depicted, this primary controller (700) directly controls the main valve (110), the first and second solenoid valves (120, 125) and the line heaters (170, 320). The primary controller (700) also receives signals from the RTD (185) associated with the line heaters (170, 320) and the pressure sensors (260, 270). As shown on FIG. 3 by standard symbols, some of the control elements are conveniently electrical and some pneumatic.

A motor control board (710), such as the model DMC-2143-DB-28040-5V-NRE2096 manufactured by Galil Motion Control, Inc. of Rocklin, Calif., is suitable for control of pneumatic regulators (730) that regulate pressures for the shower-cap coolers (210) on the crucibles (190) and that control the operation of the crucible valves (220). The motor control board (710) also provides direct electrical control of the motor or motors (720) used for movement of the position of the injection tube (340) inside the FIB. Such motors will have a position encoding means (not shown) for position feedback to the motor controller (710).

A temperature control board (740), such as the model EMC40-R-R-R-R-48-00-00-00-00-00-000 temperature controller manufactured by Athena Controls, Inc., of Plymouth Meeting, Pa., is suitable for the operation of the thermoelectric coolers (240). This controller (740) also receives input from corresponding RTD's (250) associated with each crucible (190), and communicates with the primary controller (700) in the system.

The reader will understand that the control arrangement described above and in FIG. 3 is exemplary, and that other control systems could be constructed by those skilled in the art to carry out the methods here disclosed.

The computer program or programs that run and monitor the operation of the gas injection system allow the user to choose the length of the gas pulse duty cycle. Instead of having a constant flow of carrier gas, whether the user needs it at any moment or not, the carrier gas is released into the system in small portions, the amount of which can easily be calculated given the known volume of the carrier gas valves (120, 125), the volume of the transfer tube (130) between the carrier gas valves (120, 125) and the temperature and pressure of the carrier gas.

As an example, let us assume that the precursor period is equal to ten seconds, and its duty cycle is 10%. In this example, the crucible valve (220) will be open for about one second and closed for the following nine seconds. This pulsing cycle will be repeated about every ten seconds. If a regime with one carrier gas pulse per precursor duty cycle is chosen, the carrier gas pulse will preferably occur about 4.5 seconds after the crucible valve (220) is closed; that is, the carrier gas pulse duration will be brief, usually about 2 ms, as stated above, and the time period before the crucible valve (220) is open again will constitute about 4.5 seconds thereafter.

Temperature control of the crucible is accomplished using the thermoelectric cooling element (240) attached to the crucible (190). The vapor pressure of the precursor depends on the temperature of the precursor. To maintain the desired vapor pressure for the process flow, heating or cooling of the precursor may be necessary. A temperature range of 23 deg. C. to 40 deg. C. has been found to be an optimum range for solid precursors, and a range of 0 deg. C. to 10 deg. C. suitable for liquid precursors.

The release of the precursor into the main line (290) is performed in two steps:

1. The crucible valve (220) opens for a short time, predetermined by the crucible (200) duty cycle, and a small portion of the precursor gas is released into the main line (290).

2. After the crucible valve (220) is opened for this short time, the carrier gas solenoid valves (120, 125) are opened and closed in sequence.

Figure 4A:
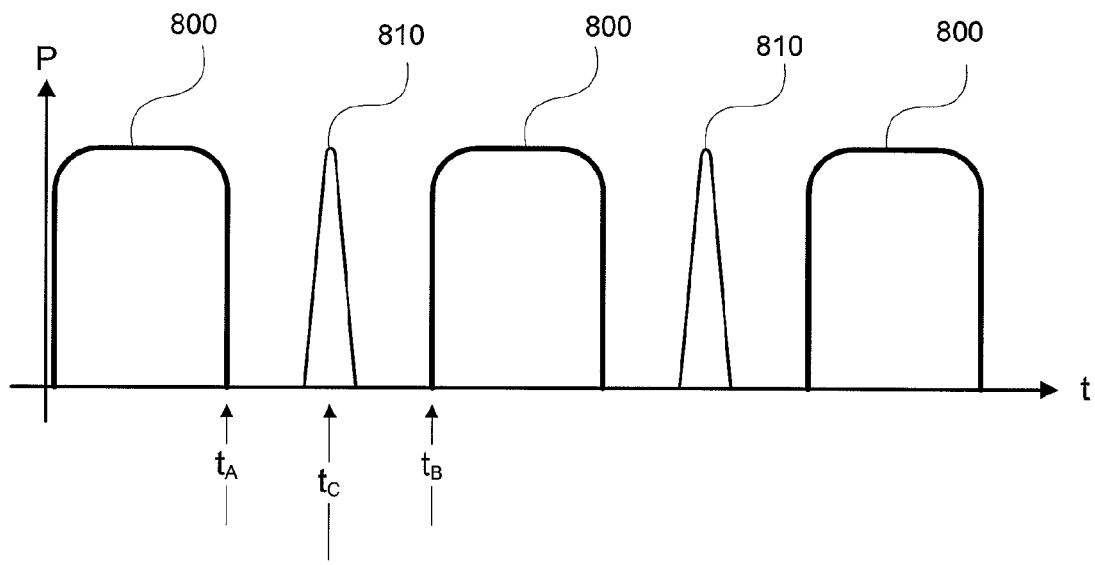
FIG. 4 depicts graphs of the cycles of carrier gas and precursor gas during the operation of the preferred embodiment.
Figure 4B:
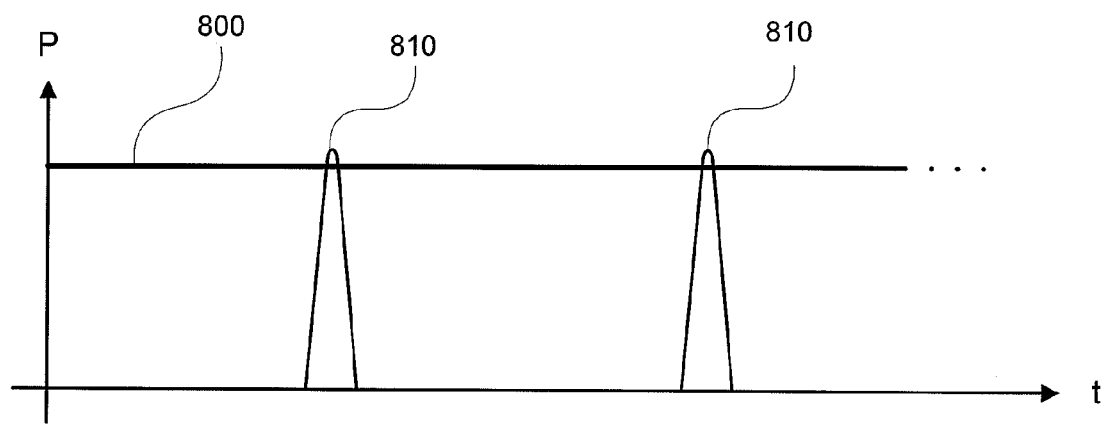

Thereby, a small portion of the carrier gas is released into the main line (290) right after the precursor portion, increasing the flow rate of the precursor in the main line (290) and the velocity of the gas exiting the needle of the injection tube (340). FIG. 4 shows graphs depicting the typical relative durations for the pulses of precursor gas flow (800) and carrier gas flow (810). FIG. 4A is typical for precursor compounds having a high vapor pressure, and FIG. 4B is typical for precursor compounds having a low vapor pressure. FIG. 4B shows a continuously-open crucible valve (220) in the latter case. In FIG. 4A, the time of the pulse of carrier gas flow (810) is a time $t_C$, preferably halfway between time $t_A$ and time $t_B$.

The additional important feature of this method is that it provides the ability to control the outgoing gas velocity at the end point of the injection tube (340). This goal can be achieved by monitoring the output pressure sensors (260, 270).

Before the start of the gas delivery process, the user can choose the values of both maximum main line (290) pressure and maximum envelope (300) pressure. Setting up these limits, the user can prevent raising the pressure of the FIB chamber to a level that would be not acceptable for a vacuum chamber. The exact values of these limits would be the user's choice and will be determined by the specific FIB apparatus used. The limitation of the velocity of the gas, exiting the injection tube (340), gives the user an opportunity to vary the distance between the tip of the injection tube (340) and the area of interest without changing the concentration of the gas arriving at the target location.

Some care should be applied while using the low vapor pressure precursors, since the line pressure can be raised to a level high enough to be comparable with the precursor pressure, and the line pressure will affect the flow of the precursor and can finally slow it down.

Figure 5:
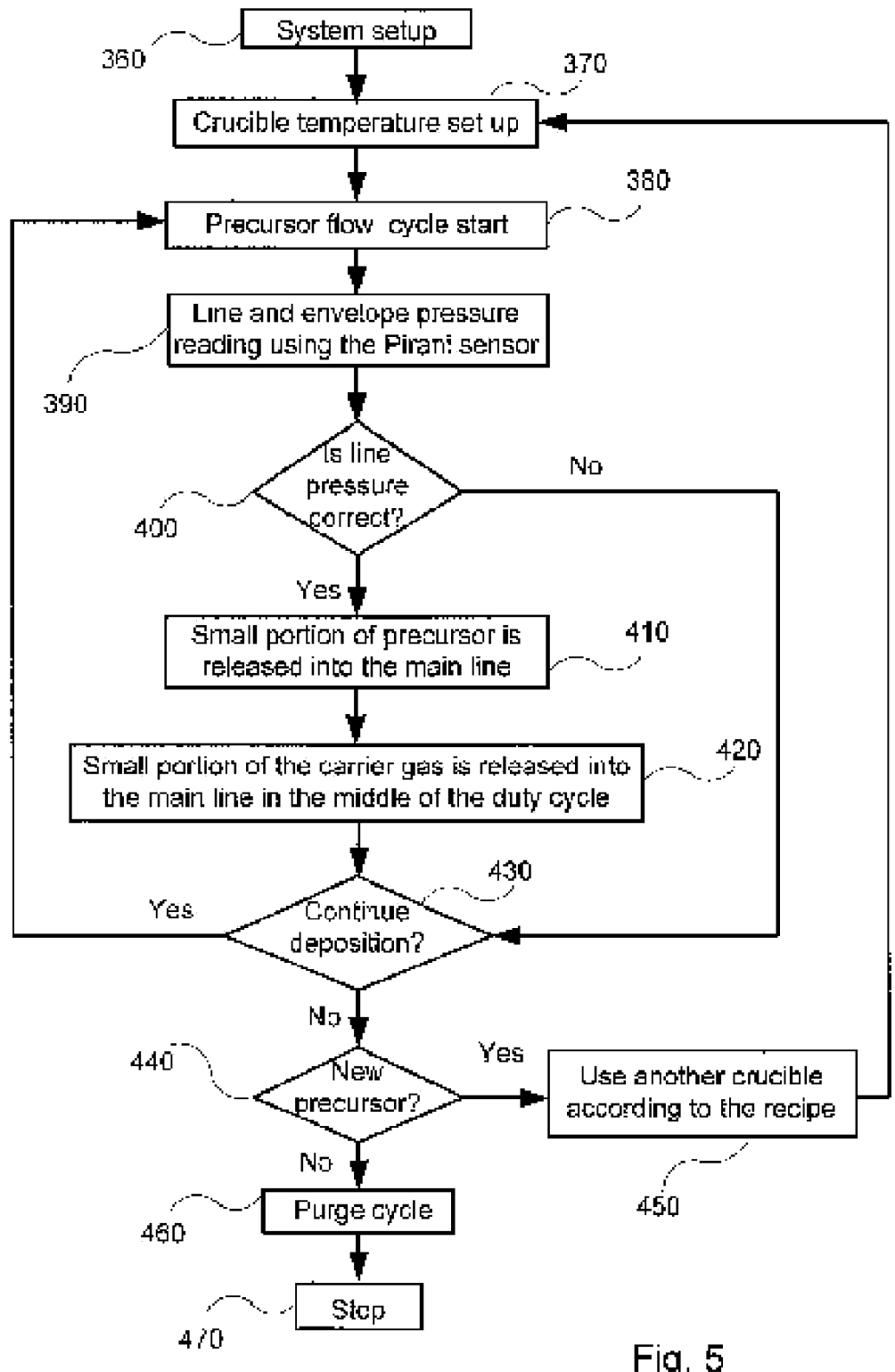
FIG. 5 is a flowchart of a material deposition process using the gas flow control system.

FIG. 5 shows the steps in the program running on the computer (350) of the preferred embodiment. The computer (350) will have the machine-readable instructions for carrying out the following steps.

At step 360, the system is set up. This step includes the assembly of the system and establishing the user-defined setups, including the length of the duty cycle, number of carrier pulses per duty cycle, maximum line pressure and maximum envelope pressure etc. At step 370, the crucible temperature is set up to the desired value using the thermoelectric coolers (240). At step 380, the duty cycle starts, the crucible valve (220) is opened and a small portion of the precursor is released into the main line (290).

The pressure sensors (260, 270) monitor the pressure change at step 390. The program conducts a comparison of the line pressure value to the pre-determined maximum value at step 400. If the pressure does not fall to the pre-determined pressure below maximum pressure, the process continues at step 430. Else, at step 410, a small portion of the precursor gas is released into the main line (290). Following step 410, a small portion of the carrier gas is released into the main line in the middle of the duty cycle at step 420. As a result, the precursor receives an additional impact into the main line (290). These actions cause changes in the pressure in the main line (290) and also inside the system envelope (300). At step 430, the decision whether to continue deposition with the same precursor is made. If the decision is "Yes," the process continues, returning to the cycle start step 380, and the precursor flow cycle starts over. If the decision is "No", the next decision whether to use a different precursor from another crucible is made at step 440. If the decision at step 440 is "Yes," the system proceeds to the use of another crucible according to the recipe at step 450, and starting the cycle over from the step 370. If the decision at step 440 is "No," a purge cycle is initiated at step 460, followed by termination of the operation at step 470.

Carrier Gas Delivery Control

The carrier gas delivery system allows the user to control the regime and the flow of carrier or purge gas for a user determined duty cycle. Since the system (100) operates using a single main line (290) for the gas delivery, it is usually necessary to purge the main line (290) after use to eliminate any excess gas remaining in it. The precursors can be in the solid, liquid or gaseous state. The type of the precursor used will determine the purge cycle needed to clean up the main line (290) after the end of a duty cycle.

Each carrier gas can be directed to its own independent heating chamber (180). This gives user the opportunity of using different carrier gases on demand or using the increased flow of the same carrier gas. The heating element (170), shown in FIGS. 1 and 3, is controlled by the computer (350) through the controller (700) and allows achieving a carrier gas temperature interval between 20 deg. C. to 80 deg. C. When the heat is off, the carrier gas would be at room temperature (approximately 20 deg. C.). The solenoid valves (120, 125) are also controlled by the computer (350) through the controller (710). The carrier gas flows to the first series of solenoid valves (125). The solenoid valves (120, 125) operate under the pulsing regime with the period between "on" and "off" states approximately 2 milliseconds. When the first solenoid valve (125) is switched "on", the carrier gas flows into the small intermediate tube (130), located between the valves (120, 125), and the flow is stopped there. At this stage, the intermediate tube is filled with the carrier gas and both solenoid valves (120, 125) are in the position "off", so this amount of carrier gas is sealed there. The volume of the intermediate tube (130) is known, and the user will thus know the amount of carrier gas, released into the vacuum chamber. When the second solenoid valve (120) is switched "on", this pre-determined amount of carrier gas is released into the main line (290) with the entry point located behind the precursor entry point. Thus, the portion of the carrier gas released into the main line (290) will increase the precursor flow rate. When the solenoid valves (120, 125) are shut, there is no additional precursor flow increase.

Purge Cycle

Figure 6:
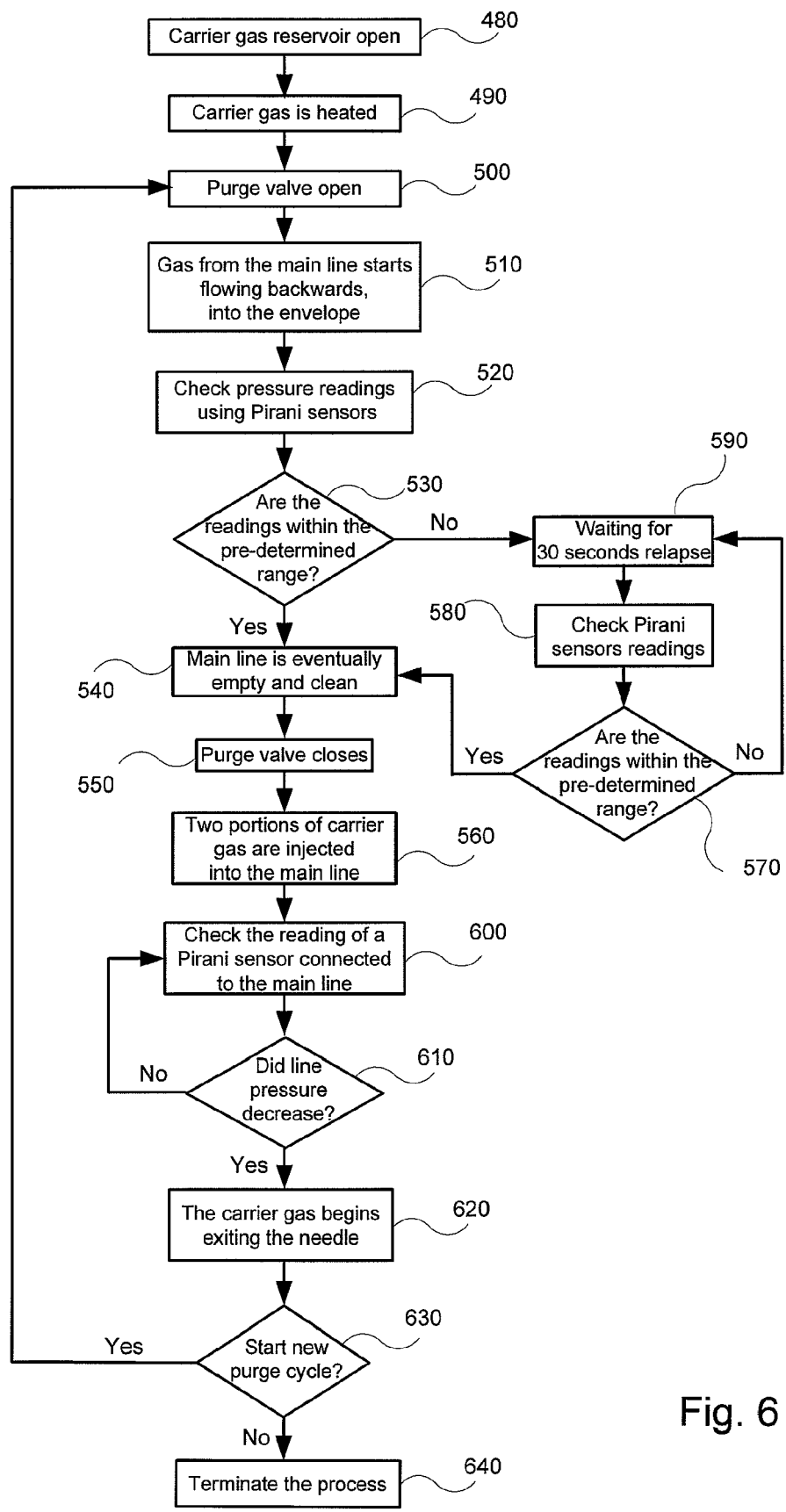
FIG. 6 is a flow chart of a solid source purge cycle.

If a liquid or solid precursor is used, the purge procedure as shown in FIG. 6 will be used first, followed by several portions of carrier gas injected into the main line (290). These injections will continue until the maximum values of line (290) and envelope (300) pressure are reached. Each injection cycle typically lasts for approximately 30 seconds and the number of cycles is determined for each precursor by the user at the setup stage.

As shown in FIG. 6, the carrier gas starts flowing at step 480 into the heating chamber (180), where it is being heated up at step 490. When the main purge valve (110) is open at step 500, the gas remaining in the main line (290), starts flowing backwards, into the envelope (300). A pressure reading is taken at step 510, using the envelope pressure sensor (260). The computer checks if the readings from both sensors (260, 270) are within the pre-determined pressure range at step 530. (The pre-determined pressure range will be some small value, where the pressure differential between the pressure in the main line (290) and the envelope (300) are substantially equal.) If the answer is "No," the computer (350) waits for about 30 seconds for relapse time, and then checks the readings of the pressure sensor (260) again. The computer (350) will repeat this cycle until the readings are within the pre-determined pressure range. When this happens and the answer to the choice of step 530 is "Yes," this would mean that the main line (290) is substantially empty and clean, as reflected at step 540. After that, the main purge valve (110) closes at step 550, and two portions of carrier gas are injected into the main line (290) at step 600. At step 600, the computer (350) checks the reading of the pressure sensor (270), connected to the main line (290), and evaluates whether the line pressure has been decreased at step 610. If the answer is "No," the computer will repeat the check at step 610 until the answer is "Yes". That would mean that the carrier gas began exiting the injection tube (340). Next, the choice can be made at step 630, whether to start a new purge cycle. If the answer is "Yes", the computer returns to step 500 and the purging cycle starts from the beginning. If the answer is "No," the process is terminated at step 640.

We claim:

1. A method for delivering a precursor material to a surface inside the vacuum chamber of an irradiation-beam instrument, the method comprising:
   flowing precursor material into a main gas line; and,
   flowing at least one pulse of carrier gas into the main gas line at a point upstream from the precursor material;
      where the flowing of the at least one pulse of carrier gas comprises
         opening a first carrier gas valve for a predetermined time and thereafter closing the first carrier gas valve, and thereafter,
         opening a second carrier gas valve for a predetermined time and thereafter closing the second carrier gas valve.

2. The method of claim 1, where the flow of the carrier gas begins at a time after the flow of the pulse of precursor material.

3. The method of claim 2, further comprising:
   controlling the velocity of precursor material at the surface by adjusting the duration of the flow of precursor material and the duration of the pulse of carrier gas.

4. The method of claim 3, where adjusting the duration of the flow of precursor material and the duration of the pulse of carrier gas further comprises:
   measuring the pressure in an envelope in fluid communication with a vacuum chamber enclosing the sample;
   measuring the pressure in the main gas line;
   computing the duration of the flow of precursor material and the duration of the pulse of carrier gas so as to maintain the pressure in the envelope and the pressure in the main gas line below pre-determined maximum values.

5. A method for purging a system for delivering a precursor material to a surface inside the vacuum chamber of an irradiation-beam instrument; where a system for delivery of a precursor material or a carrier gas to a surface comprises an envelope; a main gas line, and a purge valve connected between the envelope and the main gas line; the method comprising:
   opening a purge valve connected between the envelope and the main gas line when the pressure in the envelope is less than the pressure in the main gas line, so that a precursor material or a carrier gas, or both, in the injection tube and main gas line flow back into the envelope;
   measuring the pressure in an envelope in fluid communication with a vacuum chamber enclosing the sample;
   measuring the pressure in a main gas line, where the main gas line is connected to an injection tube inside the vacuum chamber; and,
   closing the purge valve when the pressure in the envelope and the pressure in the main gas line are substantially equal.

6. The method of claim 5, further comprising:
   flowing carrier gas into the main line after closing the purge valve.

7. The method of claim 5, further comprising:
   measuring the pressure in the main gas line during the flow of carrier gas after the closing of the purge valve; and,
   opening the purge valve to start a new purge cycle when the pressure in the main gas line decreases.

8. The method of claim 7 where the flow of carrier gas after the closing of the purge valve is pulsed.

* * * * *